United States Patent
Park et al.

(10) Patent No.: US 9,953,749 B2
(45) Date of Patent: Apr. 24, 2018

(54) RESISTOR ELEMENT AND RESISTOR ELEMENT ASSEMBLY

(71) Applicant: SAMSUNG ELECTRO-MECHANICS CO., LTD., Suwon-si, Gyeonggi-do (KR)

(72) Inventors: Kwang Hyun Park, Suwon-si (KR); Hae In Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/464,649

(22) Filed: Mar. 21, 2017

(65) Prior Publication Data

US 2018/0061533 A1    Mar. 1, 2018

(30) Foreign Application Priority Data

Aug. 30, 2016  (KR) .................. 10-2016-0110456
Sep. 13, 2016  (KR) .................. 10-2016-0118386

(51) Int. Cl.
*H01C 1/012*  (2006.01)
*H01C 1/06*   (2006.01)
*H01C 1/14*   (2006.01)

(52) U.S. Cl.
CPC .............. *H01C 1/06* (2013.01); *H01C 1/012* (2013.01); *H01C 1/14* (2013.01)

(58) Field of Classification Search
CPC ............. H01C 1/06; H01C 1/012; H01C 1/14
USPC ....................................................... 338/306
See application file for complete search history.

(56) References Cited

U.S. PATENT DOCUMENTS

| 5,552,757 | A  | * | 9/1996 | Blecha ............ | H01C 7/006 29/623 |
| 6,191,928 | B1 | * | 2/2001 | Rector ............. | H01C 7/006 361/111 |
| 8,345,404 | B2 | * | 1/2013 | Nozoe ............. | H01C 1/146 361/212 |
| 8,421,582 | B2 | * | 4/2013 | Hiehata .......... | H01C 7/108 338/20 |
| 2009/0035560 | A1 | * | 2/2009 | Block .............. | H01C 1/14 428/336 |

(Continued)

FOREIGN PATENT DOCUMENTS

JP    2002-538601 A    11/2002
JP         5292728 B2    9/2013

(Continued)

*Primary Examiner* — Kyung Lee
(74) *Attorney, Agent, or Firm* — McDermott Will & Emery LLP

(57) ABSTRACT

A resistor element includes a base substrate having first and second surfaces opposing each other; a resistor layer disposed on the first surface of the base substrate; first and second terminals disposed on opposing end portions of the base substrate, respectively, and electrically connected to opposing sides of the resistor layer, respectively; a third terminal disposed between the first terminal and the second terminal on the second surface of the base substrate and spaced apart from the first terminal and the second terminal; and electrostatic discharge (ESD)-preventing members connecting the first terminal and the third terminal to each other and connecting the second terminal and the third terminal to each other.

27 Claims, 5 Drawing Sheets

(56) References Cited

U.S. PATENT DOCUMENTS

| | | | |
|---|---|---|---|
| 2009/0231763 A1* | 9/2009 | Chen | H01C 7/12 |
| | | | 361/1 |
| 2010/0134235 A1* | 6/2010 | Yoshioka | H01C 1/142 |
| | | | 338/21 |
| 2011/0133337 A1* | 6/2011 | Shau | H01L 21/561 |
| | | | 257/738 |
| 2015/0223369 A1* | 8/2015 | Otsubo | H01T 1/20 |
| | | | 361/111 |
| 2017/0236640 A1* | 8/2017 | Kim | H01G 2/14 |
| | | | 361/220 |

FOREIGN PATENT DOCUMENTS

| KR | 10-1004724 B1 | 1/2011 |
|---|---|---|
| WO | 2000/051152 A1 | 8/2000 |

* cited by examiner

I-I'

I-I'

RESISTOR ELEMENT AND RESISTOR ELEMENT ASSEMBLY

CROSS-REFERENCE TO RELATED APPLICATION(S)

This application claims the benefit of priority to Korean Patent Application Nos. 10-2016-0110456 filed on Aug. 30, 2016 and 10-2016-0118386 filed on Sep. 13, 2016 in the Korean Intellectual Property Office, the entire disclosures of which are incorporated herein by reference for all purposes.

BACKGROUND

1. Field

The present disclosure relates to a resistor element and a resistor element assembly.

2. Description of Related Art

Electronic apparatuses that have been digitized and operate at increased speeds are sensitive to external stimuli, such that signal distortion and circuit damage may occur due to external noise.

Particularly, portable electronic apparatuses such as smartphones, tablet personal computers (PC), and the like, are frequently exposed to external impacts such as electrostatic discharge (ESD) or electromagnetic waves.

A resistor element with a chip shape is appropriate for implementing a precise degree of resistance, and serves to adjust a current and drop a voltage within the circuit.

Abnormal voltage, such as ESD, in a circuit containing the resistor element can cause damage within the resistor element, such as a short circuit. In such a case, all of the current of a power supply flows to an integrated circuit (IC), which causes secondary damage to the IC.

In order to prevent the phenomenon described above, one may consider designing the circuit using a plurality of resistors. However, that design inevitably increases the space occupied by the plurality of resistors.

In a portable electronic apparatus that has been gradually minimized and operates with a high precision, it is not preferable to increase the amount of space occupied by the plurality of resistors used for the purpose of circuit stability. Therefore, countermeasures to effectively prevent damage to the resistor element due to overvoltage events are required.

SUMMARY

The following discussion introduces a selection of concepts in a simplified form that are further described below, and is not intended to limit the scope of the claimed subject matter.

A resistor element is capable of improving anti-surge performance, that is, resistance against an overvoltage, and a resistor element assembly includes the same.

A resistor element may include a base substrate with first and second surfaces opposing each other. A resistor layer may be on the first surface of the base substrate. First and second terminals may be on opposing end portions of the base substrate, respectively, and electrically connected to opposing sides of the resistor layer, respectively. A third terminal may be between the first terminal and the second terminal on the second surface of the base substrate and spaced apart from the first terminal and the second terminal. Electrostatic discharge (ESD)-preventing members may electrically connect the first terminal to the third terminal and electrically connect the second terminal to the third terminal.

In another general aspect, a resistor element assembly may include a circuit board having a plurality of electrode pads. A resistor element may be on the circuit board and electrically connected to the plurality of electrode pads. The resistor element may include a base substrate with first and second surfaces opposing each other A resistor layer may be on the first surface of the base substrate. First and second terminals may be on opposing end portions of the base substrate, respectively, and electrically connected to opposing sides of the resistor layer, respectively. A third terminal may be between the first terminal and the second terminal on the second surface of the base substrate and spaced apart from the first terminal and the second terminal. ESD-preventing members may electrically connect the first terminal to the third terminal and electrically connect the second terminal to the third terminal.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
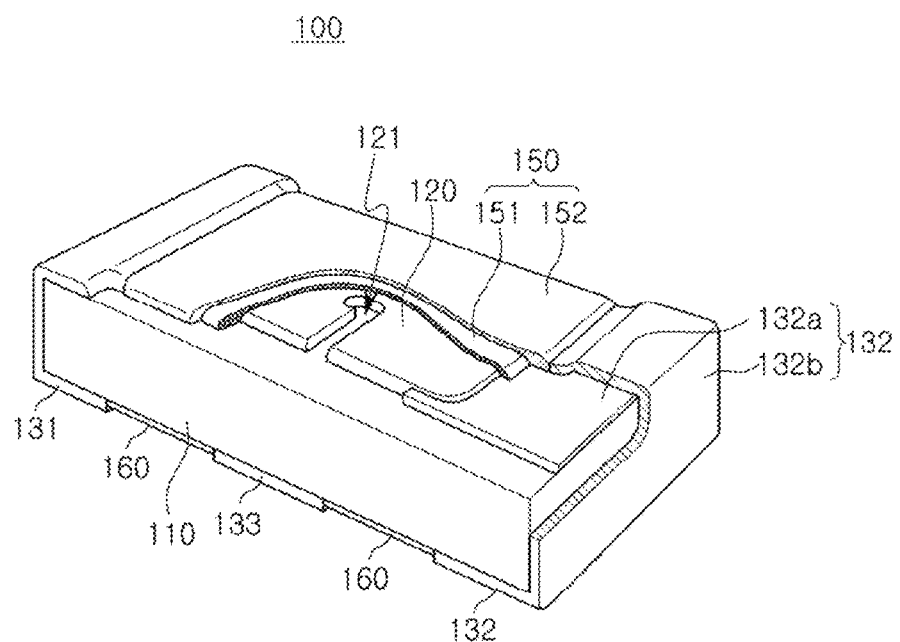
FIG. 1 is a perspective and partial cross-section view illustrating an exemplary embodiment of a resistor element.
Figure 2:
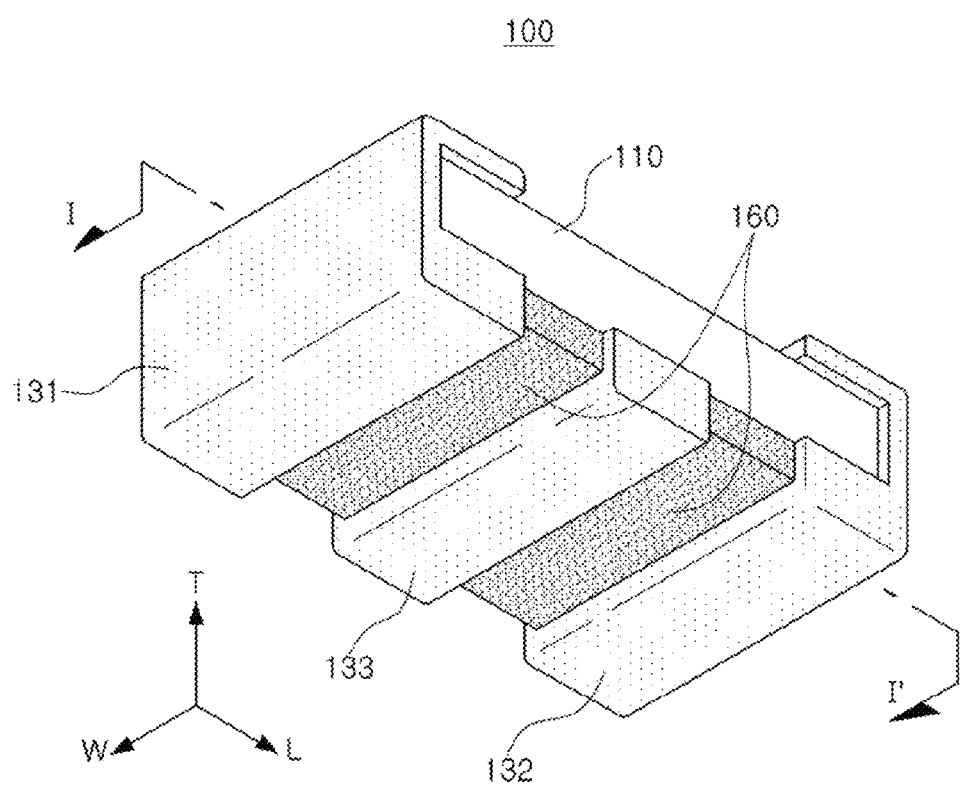
FIG. 2 is a perspective view illustrating the resistor element of FIG. 1 when viewed from another viewpoint.
Figure 3:
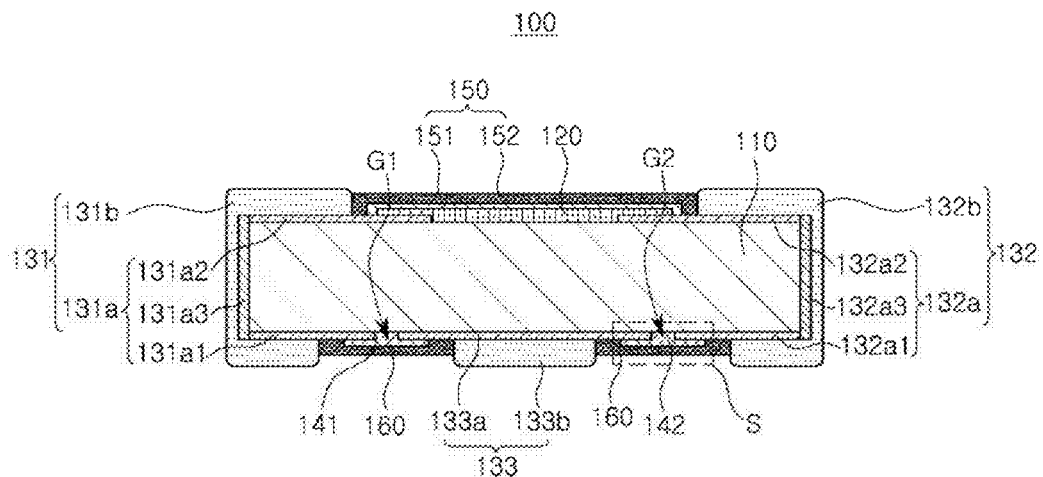
FIG. 3 is a cross-sectional view illustrating the exemplary embodiment of FIG. 1 taken along line I-I' of FIG. 2.

FIG. 1 is a perspective and partial cross-section view illustrating an exemplary embodiment of a resistor element. FIG. 2 is a perspective view illustrating the resistor element of FIG. 1 when viewed from another viewpoint. FIG. 3 is a cross-sectional view illustrating the exemplary embodiment of FIG. 1 taken along line I-I' of FIG. 2.

Referring to FIGS. 1 through 3, a resistor element 100 includes a base substrate 110, a resistor layer 120, first to third terminals 131 to 133, and electrostatic discharge (ESD)-preventing members 141 and 142.

The base substrate 110 supports the resistor layer 120 and secures the strength of the resistor element 100. The base substrate 110 has a predetermined thickness and has a thin plate shape that includes first and second surfaces opposing each other and each having a rectangular shape, but is not limited thereto.

The base substrate 110 is formed of a material with excellent thermal conductivity, and externally dissipates heat generated in the resistor layer 120 when the resistor element is in use.

The base substrate 110 may be formed of a ceramic material such as alumina ($Al_2O_3$) or polymer, for example, an alumina substrate obtained by anodizing a surface of thin plate-shaped aluminum.

The resistor layer 120 is on one surface of the base substrate 110. The resistor layer 120 is between first and second terminals 131 and 132 spaced apart from each other, and electrically connected to the first and second terminals 131 and 132 to thus be used as a resistor component.

As illustrated in FIG. 1, the first and second terminals 131 and 132 are disposed on opposing end portions of the base substrate, respectively, and electrically connected to opposing sides of the resistor layer 120.

Various metals or alloys, or a compound such as an oxide may be used as the material of the resistor layer 120. For example, the resistor layer 120 may include at least one of Cu—Ni based alloys, Ni—Cr based alloys, an Ru oxide, an Si oxide, Mn, and Mn based alloys.

The resistance of the resistor layer 120 may be set by a trimming process. The trimming process refers to a partial removing process of the resistor layer through fine cutting, or the like, of the resistor layer in order to obtain a resistance value required for a design of a circuit after the resistor layer is formed.

As illustrated in FIG. 1, the resistor layer 120 includes a region 121 removed by the trimming process.

A protective layer 150 may be on a surface of the resistor layer 120. The protective layer 150 may be between the first and second terminals 131 and 132, may prevent the resistor layer 120 from being externally exposed, and may protect the resistor layer 120 from external impact. The protective layer 150 may include silicon ($SiO_2$), glass, or polymer, for example.

The protective layer 150 may include a first protective layer 151 of glass and a second protective layer 152 of polymer. The first protective layer 151 may be formed before the trimming process to prevent generation of a crack in the resistor layer 120 in the trimming process, with the second protective layer 152 formed after the trimming process to protect the resistor layer 120.

Even though the protective layer 150 is disposed on the resistor layer 120, the first and second terminals 131 and 132 may protrude farther than the protective layer 150, such that the first and second terminals 131 and 132 are able to contact electrode pads on a circuit board when mounting the resistor element 100.

As illustrated in FIG. 2, the third terminal 133 is disposed on the second surface of the base substrate opposing the first surface of the base substrate on which the resistor layer 120 is disposed. The third terminal 133 is disposed between the first and second terminals 131 and 132 to be spaced apart from the first and second terminals 131 and 132.

The first to third terminals 131 to 133 are disposed to be separated from one another when viewed from the second surface of the base substrate 110.

As illustrated in FIG. 3, the ESD-preventing members may include a first ESD-preventing member 141 and a second ESD-preventing member 142. The first ESD-preventing member 141 and the second ESD-preventing member 142 may be spaced apart from each other. In this case, the third terminal 133 may be in a space between the first ESD-preventing member 141 and the second ESD-preventing member 142.

The ESD-preventing members are disposed to electrically connect the first to third terminals 131 to 133 to each other. The first ESD-preventing member 141 may electrically connect the first terminal 131 to the third terminal 133, and the second ESD-preventing member 142 may electrically connect the second terminal 132 to the third terminal 133.

The ESD-preventing members 141 and 142 may fill gaps G1 and G2 between the first to third terminals 131 and 133. That is, the first ESD-preventing member 141 may fill the gap G1 between the first terminal 131 and the third terminal 133 and electrically connect the first terminal 131 to the third terminal 133. The second ESD-preventing member 142 may fill the gap G2 between the second terminal 132 and the third terminal 133 and electrically connect the second terminal 132 to the third terminal 133.

The first ESD-preventing member 141 may cover one end portion of the first terminal 131 and one end portion of the third terminal 133. The second ESD-preventing member 142 may cover one end portion of the second terminal 132 and the other end portion of the third terminal 133.

The first ESD-preventing member 141 and the second ESD-preventing member 142 may have insulation properties during ordinary operation, but may allow for electricity to flow when an overvoltage such as ESD is applied to the first ESD-preventing member 141 and/or the second ESD-preventing member 142. That is, electricity may flow in the first ESD-preventing member 141 and/or the second ESD-preventing member 142, such that the first ESD-preventing member 141 and/or the second ESD-preventing member 142 may discharge electric energy of the overvoltage to the third terminal 133.

Therefore, the resistor element 100 according to the exemplary embodiment may bypass and transfer the electric energy by the overvoltage applied to the first terminal 131 or the second terminal 132 to the third terminal 133 through the first ESD-preventing member 141 and the second ESD-preventing member 142.

Coating layers 160 may be disposed on surfaces of the first and second ESD-preventing members 141 and 142, respectively. The coating layers 160 may prevent the first and second ESD-preventing members 141 and 142 from being externally exposed, and protect the first and second ESD-preventing members 141 and 142 from external impact.

The coating layers 160 may include silicon ($SiO_2$), glass, or polymer, similar to the protective layer 150.

Even though the coating layers 160 are disposed on the first and second ESD-preventing members 141 and 142, the first to third terminals 131 to 133 protrude farther than the coating layers 160, such that the first to third terminals 131 to 133 are able to contact the electrode pads on the circuit board when mounting the resistor element 100.

An exemplary embodiment of the first to third terminals 131 to 133 will hereinafter be described in detail.

The first terminal 131 may include a first internal electrode 131a and a first external electrode 131b. The second terminal 132 may include a second internal electrode 132a and a second external electrode 132b. The third terminal 133 may include a third internal electrode 133a and a third external electrode 133b.

The first internal electrode 131a and the second internal electrode 132a may be on opposing end portions of the base substrate 110, respectively. The third internal electrode 133a may be on the second surface of the base substrate 110 opposing the first surface of the base substrate 110 on which the resistor layer 120 is disposed.

The first to third external electrodes 131b to 133b may be on the first to third internal electrodes 131a to 133a, respectively. That is, the first to third external electrodes 131b to 133b may cover at least portions of regions of surfaces the first to third internal electrodes 131a to 133a, respectively.

The first internal electrode 131a may include a first seed electrode 131a1 and a first backside electrode 131a2. The second internal electrode 132a may include a second seed electrode 132a1 and a second backside electrode 132a2.

The first seed electrode 131a1 and the second seed electrode 132a1 may be on the first surface of the base substrate, and the first backside electrode 131a2 and the second backside electrode 132a2 may be on the second surface of the base substrate 110 opposing the first surface of the base substrate 110. In this case, the first seed electrode 131a1 faces the first backside electrode 131a2, and the second seed electrode 132a1 faces the second backside electrode 132a2.

The first internal electrode 131a may further include a first side electrode 131a3, and the second internal electrode 132a may further include a second side electrode 132a3.

The first and second side electrodes 131a3 and 132a3 may respectively be on opposing end surfaces of a laminate formed by disposing the base substrate 110, the resistor layer 120, the first and second seed electrodes 131a1 and 132a1, and the first and second backside electrodes 131a2 and 132a2.

The first side electrode 131a3 may be connected to the first seed electrode 131a1 and the first backside electrode 131a2, and the second side electrode 132a3 may be connected to the second seed electrode 132a1 and the second backside electrode 132a2. When the first internal electrode 131a includes the first side electrode 131a3 and the second internal electrode 132a includes the second side electrode 132a3, the first and second external electrodes 131b and 132b may also be formed on the first and second side electrodes 131a3 and 132a3, respectively.

The gap G1 between the first and third terminals 131 and 133 may be a space in which the first seed electrode 131a1 and the third internal electrode 133a are spaced apart from each other, and the gap G2 between the second terminal 132 and the third terminal 133 may be a space in which the second seed electrode 132a1 and the third internal electrode 133a are spaced apart from each other.

The gaps G1 and G2 may be formed by processing at least one of the first seed electrode 131a1, the second seed electrode 132a1, and the third internal electrode 133a in a laser cutting scheme. The gaps G1 and G2 may thus be formed at more accurate widths.

The first to third internal electrodes 131a to 133a may be formed using a printing process (a process of printing and then firing a conductive paste) or a depositing process using a conductive paste. The first to third internal electrodes 131a to 133a serve as seeds in a plating process for the first to third external electrodes 131b to 133b. The internal electrodes may include at least one of silver (Ag), copper (Cu), nickel (Ni), and platinum (Pt).

The first to third external electrodes 131b to 133b may be formed on the first to third internal electrodes 131a to 133a, respectively, by a plating process. The first to third external electrodes 131b to 133b may be formed after the protective layer 150 and the coating layers 160 are formed.

The first to third external electrodes 131b to 133b may include at least one of nickel (Ni), tin (Sn), copper (Cu), and chromium (Cr). For example, each of the first to third external electrodes 131b to 133b may include a double layer of an Ni plating layer and an Sn plating layer, and may further include a Cu plating layer. The Ni plating layer can prevent a component (for example, Ag) of the internal electrode from leaching into a solder component when mounting the resistor element. The Sn plating layer may be provided to be easily bonded to the solder component at the time of mounting the resistor element. The Cu plating layer may improve conductivity of the internal electrode.

Figure 4:
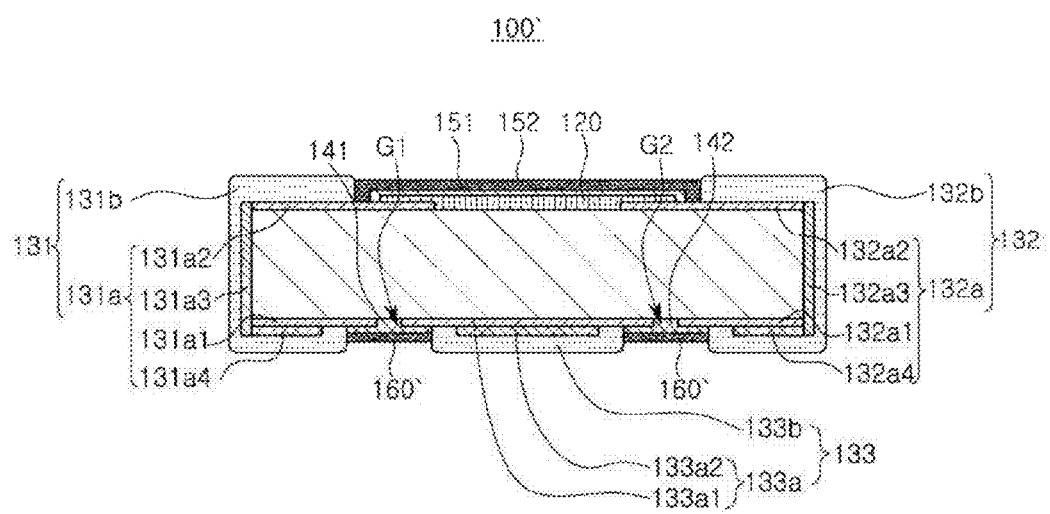
FIG. 4 is a cross-sectional view illustrating another exemplary embodiment of a resistor element taken along line I-I' of FIG. 2.

FIG. 4 is a cross-sectional view illustrating another exemplary embodiment of a resistor element taken along the line I-I' of FIG. 2.

In a resistor element 100' as illustrated in FIG. 4, the first internal electrode 131a and the second internal electrode 132a may further include a first reinforcing layer 131a4 and a second reinforcing layer 132a4, respectively. In addition, the third internal electrode 133a may include a third seed electrode 133a1 and a third reinforcing layer 133a2.

The first reinforcing layer 131a4 can be on the first seed electrode 131a1 to reinforce the thickness of the first terminal 131. The second reinforcing layer 132a4 can be on the second seed electrode 132a1 to reinforce the thickness of the second terminal 132. The third reinforcing layer 133a2 can be on the third seed electrode 133a1 to reinforce the thickness of the third terminal 133.

Coating layers 160' can be on respective surfaces of ESD-preventing members 141 and 142 exposed between first to third external electrodes 131b to 133b.

Therefore, the thicknesses of the first to third terminals 131 to 133 can be secured, such that the first to third terminals 131 to 133 can more easily be in contact with electrode pads disposed on a circuit board. In addition, since the surface areas of the first to third terminals 131 to 133 are increased, the bonding areas between the first to third terminals 131 to 133 and the solder in a mounting process are secured to improve sticking strength.

Figure 5:
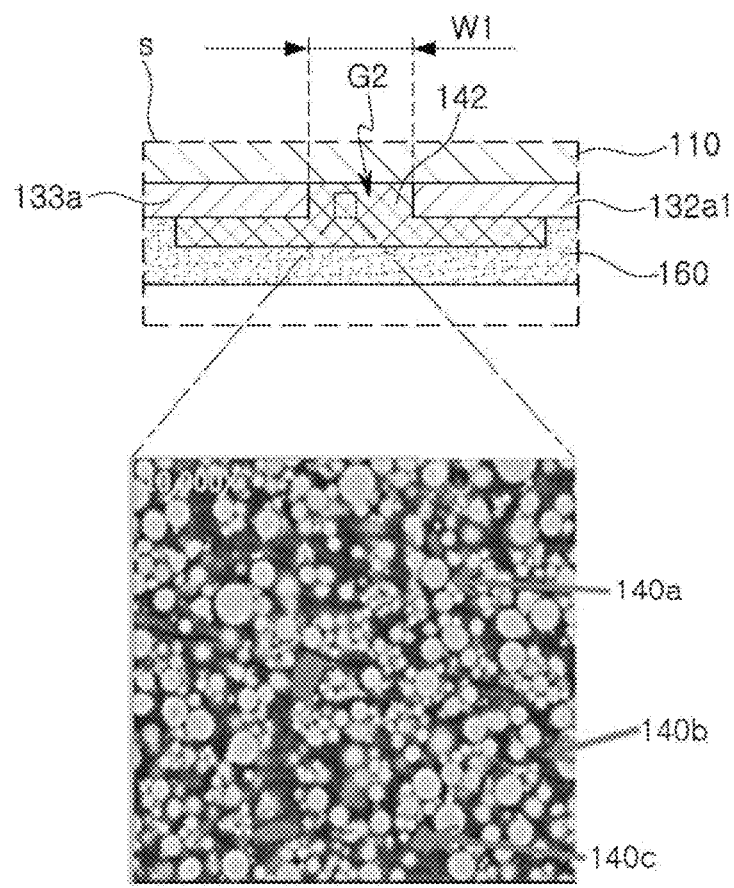
FIG. 5 is an enlarged view illustrating region S of FIG. 3 and an image of an electrostatic discharge (ESD)-preventing member taken by a scanning electron microscope (SEM)

FIG. 5 is an enlarged view illustrating region S of FIG. 3 and an image of an ESD-preventing member taken by a scanning electron microscope (SEM).

Referring to FIG. 5, the second ESD-preventing member 142 fills the gap G2 between the second seed electrode 132a1 and the third internal electrode 133a, and covers one end portion of the second seed electrode 132a1 and one end portion of the third internal electrode 133a. The coating layer 160 is disposed on the second ESD-preventing member 142, and is formed to prevent the second ESD-preventing member 142 from being externally exposed. The width W1 of the gap G2 filled by the second ESD-preventing member 142 may be 10 μm or more.

When the width W1 of the gap G2 is smaller than 10 μm, electric energy may pass to the third terminal even when the voltage applied to the resistor element is not an overvoltage.

Referring to the image of the second ESD-preventing member 142 taken by the SEM, the second ESD-preventing member 142 can include conductive particles 140a, an insulating material 140b, and insulating fillers 140c. In the second ESD-preventing member 142, the conductive particles 140a may be dispersed in the insulating material 140b. The conductive particles 140a may be a conductive metal such as Cu, Ag, Ni, Au, Ti, Cr, or the like, and the insulating material 140b may be a polymer resin. The insulating fillers 140c may be a ceramic material such as $Al_2O_3$, ZnO, or the like.

The second ESD-preventing member 142 can be a non-conductor at ordinary operating voltages, and can conduct electricity through the conductive particles 140a when an overvoltage such as ESD is applied thereto through, for example, the second seed electrode 132a1.

The limit voltage corresponding to the reference voltage at which the electricity conducts in the ESD-preventing member can be controlled by the content of conductive particles 140a and insulating material 140b included in the ESD-preventing member. The content of conductive particles 140a and insulating material 140b and the width of the gap can be selected to obtain an intended limit voltage.

The second ESD-preventing member 142 may be applied in a form of a mixed paste. The second ESD-preventing member 142 may be applied by screen printing or by dispensing. When the second ESD-preventing member 142 is applied in the screen printing scheme, a mask can have an opening where the second ESD-preventing member 142 can be disposed on the second seed electrode 132a1 and the third internal electrode 133a, and the second ESD-preventing member 142 may be then applied to the opening. The second ESD-preventing member can be printed and then hardened at a high temperature.

The abovementioned description may be similarly applied to the gap G1 between the first seed electrode 131a1 and the third internal electrode 133a and the first ESD-preventing member 141 filled in the gap G1 (see FIG. 3). An overlapping description is thus omitted.

Figure 6:
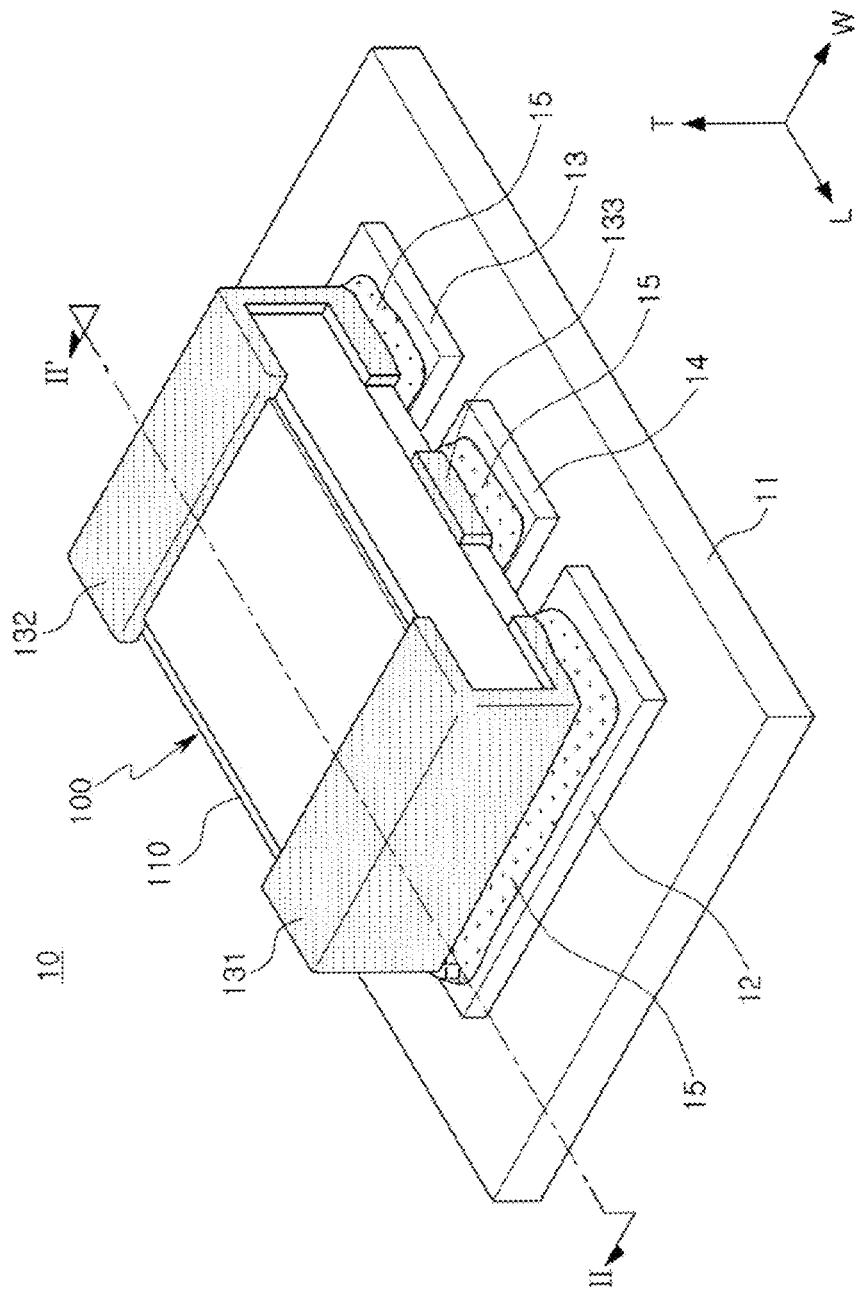
FIG. 6 is a perspective view illustrating an exemplary embodiment of a resistor element assembly.

FIG. 6 is a perspective view illustrating an exemplary embodiment of a resistor element assembly.

Figure 7:
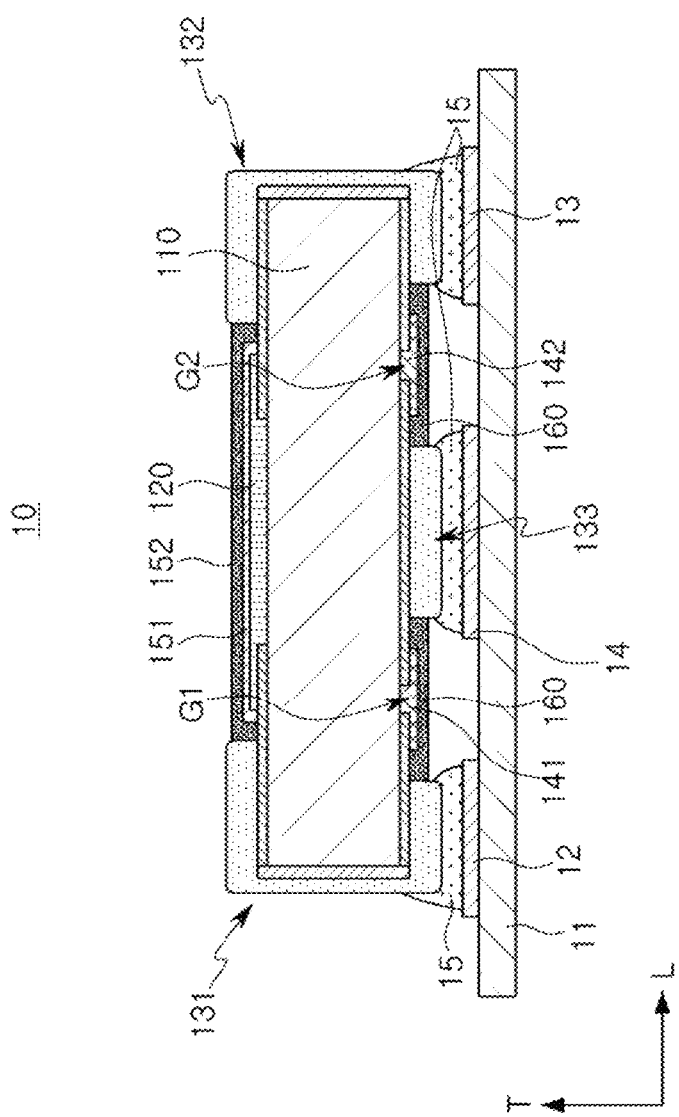
FIG. 7 is a cross-sectional view taken along line II-II' of FIG. 6.

FIG. 7 is a cross-sectional view taken along line II-II' of FIG. 6.

Referring to FIGS. 6 and 7, a resistor element assembly 10 may include the resistor element 100 illustrated in FIG. 1 and a circuit board 11 on which the resistor element 100 is mounted.

The circuit board 11 may include first to third electrode pads 12 to 14 disposed in a mounted region of the resistor element. The first to third electrode pads 12 to 14 refer to land patterns connected to circuit patterns implemented on the circuit board 11 and are provided in order to mount the resistor element.

The resistor element 100 may include the base substrate 110, the resistor layer 120 disposed on the first surface of the base substrate 110, the first and second terminals 131 and 132 disposed on opposing end portions of the base substrate 110, respectively, and electrically connected to opposing sides of the resistor layer 120, respectively, the third terminal 133 disposed between the first and second terminals 131 and 132 on the second surface of the base substrate 110 and spaced apart from the first and second terminals, and the ESD-preventing members electrically connecting the first terminal 131 to the third terminal 133 and electrically connecting the second terminal 132 to the third terminal 133.

The resistor element 100 may be understood from the resistor element described with reference to FIGS. 1 through 3, and an overlapping description is thus omitted.

The circuit board 11 may have an electronic circuit formed thereon, and an integrated circuit (IC) for a specific operation or a control of an electronic apparatus, or the like, may be formed on the circuit board 11, such that a current supplied from a separate power supply may flow to the circuit board 11.

The circuit board 11 may include various wiring lines or further include other kinds of semiconductor elements such as a transistor, and the like. The circuit board 11 may be variously configured, if necessary. For example, the circuit board 11 may include a conductive layer or include a dielectric layer.

The first to third electrode pads 12 to 14 may be disposed on the circuit board 11 spaced from each other, and may be electrically connected, respectively, to the first to third terminals 131 to 133 of the resistor element 100 by solder 15. The third electrode pad 14 electrically connected to the third terminal 133 may be electrically connected to a ground (GND) wiring.

FIGS. 6 and 7 illustrate the first electrode pad 12 electrically connected to the first terminal 131 and the second connection pad 13 electrically connected to the second terminal 132. However, the first electrode pad 12 may be electrically connected to the second terminal 132 and the second connection pad 13 may be electrically connected to the first terminal 131, depending on the design.

As described above, the first and second terminals 131 and 132 may discharge electric energy from overvoltage to the third terminal 133 through the ESD-preventing members.

Therefore, anti-surge performance, that is, resistance against an overvoltage, of the resistor element assembly may be improved.

As set forth above, in the resistor element and the resistor element assembly, electric energy from overvoltage is not bypassed to terminals to which the resistor layer is electrically connected during normal operations, but is instead bypassed to a separate terminal, such that accumulation of fatigue in the resistor element itself may be significantly reduced.

Consequently, the electric energy from overvoltage transferred to a circuit through the resistor element may be significantly reduced.

While exemplary embodiments have been shown and described above, it will be apparent to those skilled in the art that modifications and variations could be made without departing from the scope of the present invention as defined by the appended claims.

What is claimed is:

1. A resistor element comprising:
a base substrate;
a resistor layer on a first surface of the base substrate;
first and second terminals on opposing end portions of the base substrate, respectively, and electrically connected to opposing sides of the resistor layer, respectively;
a third terminal between the first terminal and the second terminal on a second surface of the base substrate opposing the first surface and spaced apart from the first terminal and the second terminal; and
electrostatic discharge (ESD)-preventing members electrically connecting the first terminal to the third terminal and electrically connecting the second terminal to the third terminal.

2. The resistor element of claim 1, wherein the ESD-preventing members fill a gap between the first terminal and the third terminal and a gap between the second terminal and the third terminal.

3. The resistor element of claim 2, wherein a width of the gap between the first terminal and the third terminal and a width of the gap between the second terminal and the third terminal are each 10 μm or more.

4. The resistor element of claim 2, wherein the first to third terminals each include an internal electrode on the second surface of the base substrate where the gaps between the internal electrodes were formed by laser cutting.

5. The resistor element of claim 1, wherein the ESD-preventing members include:
a first ESD-preventing member covering one end portion of the first terminal and one end portion of the third terminal; and a second ESD-preventing member spaced apart from the first ESD-preventing member and covering one end portion of the second terminal and the other end portion of the third terminal.

6. The resistor element of claim 5, wherein the third terminal is between the first ESD-preventing member and the second ESD-preventing member.

7. The resistor element of claim 5, further comprising coating layers on the first ESD-preventing member and the second ESD-preventing member, respectively.

8. The resistor element of claim 1, further comprising:
a first protective layer on the resistor layer and including glass; and
a second protective layer on the first protective layer and including a polymer.

9. The resistor element of claim 1, wherein the ESD-preventing members contain conductive particles, an insulating material, and insulating fillers mixed with one another.

10. The resistor element of claim 1, wherein the first to third terminals each include an internal electrode on the base substrate and an external electrode on the internal electrode.

11. The resistor element of claim 1, wherein the ESD-preventing member was formed by applying a paste using one of a screen printing method and a dispensing method.

12. The resistor element of claim 1, wherein the first to third terminals each include an internal electrode on the second surface of the base substrate that was formed by a screen printing method.

13. A resistor element assembly comprising:
a circuit board having a plurality of electrode pads; and
a resistor element on the circuit board and electrically connected to the plurality of electrode pads,
wherein the resistor element includes: a base substrate, a resistor layer on a first surface of the base substrate, first and second terminals on opposing end portions of the base substrate, respectively, and electrically connected to opposing sides of the resistor layer, respectively, a third terminal between the first terminal and the second terminal on a second surface of the base substrate opposing the first surface and spaced apart from the first terminal and the second terminal, and ESD-preventing members electrically connecting the first terminal to the third terminal and electrically connecting the second terminal to the third terminal.

14. The resistor element assembly of claim 13, wherein the ESD-preventing members fill a gap between the first terminal and the third terminal and a gap between the second terminal and the third terminal.

15. The resistor element assembly of claim 13, wherein the first to third terminals respectively include first to third internal electrodes on the base substrate and respectively include first to third external electrodes on the first to third internal electrodes.

16. The resistor element assembly of claim 13, wherein the third terminal is electrically connected to a ground, and the ESD-preventing members are electrically connected to the ground through the third terminal.

17. A resistor element comprising:
a resistor layer;
first and second terminals electrically connected to opposing sides of the resistor layer;
a third terminal spaced apart from the first terminal and the second terminal;
a first electrostatic discharge (ESD)-preventing member coupling the first terminal to the third terminal; and
a second ESD-preventing member coupling the second terminal to the third terminal,
wherein the first and second ESD-preventing members are each configured to insulate against the flow of electricity when an applied voltage is below a predetermined voltage and allow the flow of electricity when the applied voltage is above the predetermined voltage.

18. The resistor element of claim 17, wherein the first and second ESD-preventing members contain conductive particles, an insulating material, and insulating fillers mixed with one another.

19. The resistor element of claim 17, wherein:
the first, second, and third terminals, and the first and second ESD-preventing members are all on a mounting-side surface of the resistor element, and
the first, second, and third terminals protrude from the resistor element in a direction away from the mounting-side surface of the resistor element.

20. The resistor element of claim 17, wherein:
the third terminal is between the first and second terminals and spaced apart from each by respective gaps;
the first ESD-preventing member fills the gap between the first terminal and the third terminal; and
the second ESD-preventing member fills the gap between the second terminal and the third terminal.

21. The resistor element of claim 20, further comprising:
a first coating layer on the first ESD-preventing member; and
a second coating layer on the second ESD-preventing member.

22. The resistor element of claim 21, wherein:
the first and second coating layers each respectively enclose the first and second ESD-preventing members;
the first coating layer is on a portion of the first terminal and on a portion of the third terminal; and
the second coating layer is on a portion of the second terminal and on a portion of the third terminal.

23. The resistor element of claim 17, further comprising:
a first protective layer on the resistor layer and including glass; and
a second protective layer on the first protective layer and including a polymer.

24. A resistor element comprising:
a base substrate with an upper surface, a lower surface opposing the upper surface, a first end surface connecting the upper surface to the lower surface, and a second end surface connecting the upper surface to the lower surface and opposing the first end surface;
a resistor layer on the upper surface and spaced apart from the first and second end surfaces;
a third terminal on the lower surface and spaced apart from the first and second end surfaces;
a first terminal on the first end surface, extended on the upper surface from the first end surface to connect to the resistor layer, and extended on the lower surface from the first end surface to a location spaced apart from the third terminal by a first gap;
a second terminal on the second end surface, extended on the upper surface from the second end surface to connect to the resistor layer, and extended on the lower surface from the second end surface to a location spaced apart from the third terminal by a second gap;
a first electrostatic discharge (ESD)-preventing member in the first gap and connecting the first terminal to the third terminal; and
a second ESD-preventing member in the second gap and connecting the second terminal to the third terminal.

25. The resistor element of claim 24, wherein:
the first terminal comprises:
- a first backside electrode extended on the upper surface from the first end surface to connect to the resistor layer,
- a first seed electrode extended on the lower surface from the first end surface to the location spaced apart from the third terminal by the first gap, and
- a first side electrode on the first end surface and connecting the first backside electrode to the first seed electrode; and the second terminal comprises:
- a second backside electrode extended on the upper surface from the second end surface to connect to the resistor layer,
- a second seed electrode extended on the lower surface from the second end surface to the location spaced apart from the third terminal by the second gap, and
- a second side electrode on the second end surface and connecting the second backside electrode to the second seed electrode.

26. The resistor element of claim 25, further comprising:
a protective layer, including:
- a first protective layer on the resistor layer and including glass;
- a second protective layer on the first protective layer and including a polymer;

a first coating layer on the first ESD-preventing member; and a second coating layer on the second ESD-preventing member.

27. The resistor element of claim 26, wherein:
the first terminal further comprises a first external electrode on the first backside electrode, first seed electrode, and first side electrode, and is adjacent to the protective layer and adjacent to the first coating layer;

the second terminal further comprises a second external electrode on the second backside electrode, second seed electrode, and second side electrode, and is adjacent to the protective layer and adjacent to the second coating layer.

* * * * *